United States Patent [19]
Cole

[11] Patent Number: 6,008,449
[45] Date of Patent: Dec. 28, 1999

[54] REFLECTIVE CONCENTRATING SOLAR CELL ASSEMBLY

[76] Inventor: Eric D. Cole, 14076 Winding Ridge La., Centreville, Va. 20121

[21] Appl. No.: 08/914,323

[22] Filed: Aug. 19, 1997

[51] Int. Cl.[6] .................................................. H01L 25/00
[52] U.S. Cl. ............................................................ 136/246
[58] Field of Search .............................................. 136/246

[56] References Cited

U.S. PATENT DOCUMENTS

| | | | |
|---|---|---|---|
| Re. 29,833 | 11/1978 | Mlavsky | 136/89 |
| 3,134,906 | 5/1964 | Henker | 250/211 |
| 3,444,381 | 5/1969 | Wendland | 250/211 |
| 3,591,348 | 7/1971 | La Belle, Jr. | 23/301 |
| 3,687,633 | 8/1972 | La Belle, Jr. et al. | 23/273 |
| 3,873,829 | 3/1975 | Evrard et al. | 250/213 |
| 3,973,994 | 8/1976 | Redfield | 136/89 |
| 3,984,256 | 10/1976 | Fletcher et al. | 136/89 |
| 3,990,914 | 11/1976 | Weinstein et al. | 136/89 |
| 4,056,404 | 11/1977 | Garone et al. | 136/89 |
| 4,116,718 | 9/1978 | Yerkes et al. | 136/89 |
| 4,143,234 | 3/1979 | Johnson et al. | 136/89 |
| 4,152,536 | 5/1979 | Ravi | 136/89 |
| 4,162,928 | 7/1979 | Shepard, Jr. | 136/89 |
| 4,200,472 | 4/1980 | Chappell et al. | 136/89 |
| 4,235,643 | 11/1980 | Amick | 136/246 |
| 4,246,042 | 1/1981 | Knasel et al. | 136/246 |
| 4,311,869 | 1/1982 | Kurth et al. | 136/246 |
| 4,313,023 | 1/1982 | Stephens | 136/246 |
| 4,321,417 | 3/1982 | Kurth et al. | 136/246 |
| 4,493,942 | 1/1985 | Sheng et al. | 136/259 |
| 4,638,110 | 1/1987 | Erbert | 136/246 |
| 4,913,744 | 4/1990 | Hoegl et al. | 136/244 |
| 5,240,510 | 8/1993 | Goldade et al. | 136/259 |
| 5,261,970 | 11/1993 | Landis et al. | 136/259 |
| 5,288,337 | 2/1994 | Mitchell | 136/246 |
| 5,437,736 | 8/1995 | Cole | 136/259 |

FOREIGN PATENT DOCUMENTS

| | | |
|---|---|---|
| 0029721A1 | 6/1981 | European Pat. Off. . |
| 0042458A1 | 12/1981 | European Pat. Off. . |
| 0575797A1 | 12/1993 | European Pat. Off. . |
| 56-118377 | 9/1981 | Japan . |
| WO 95/15582 | 6/1995 | WIPO . |

*Primary Examiner*—Mark Chapman
*Attorney, Agent, or Firm*—Seed and Berry LLP

[57] ABSTRACT

A solar cell assembly for focusing incident radiation on a solar cell. The assembly comprises a reflective member having first and second opposite surfaces. The first surface is transparent to allow incident radiation to pass into the reflective member. The second surface has a plurality of reflective portions positioned to receive the radiation and reflect and focus the radiation toward the first surface. The radiation strikes the first surface at an angle greater than a critical angle of the first surface and is reflected and focused back toward the second surface. The assembly further comprises a solar cell positioned at least proximate to the reflective member to receive the radiation reflected and focused from the first surface of the reflective member and generate electric current from the radiation.

45 Claims, 9 Drawing Sheets

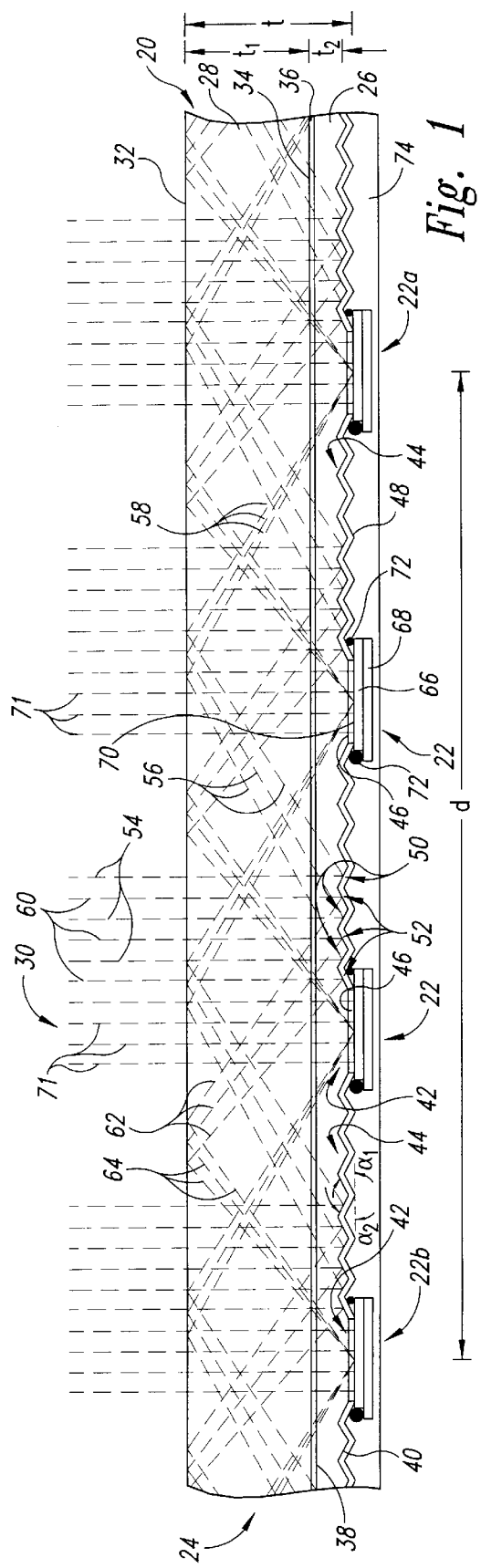
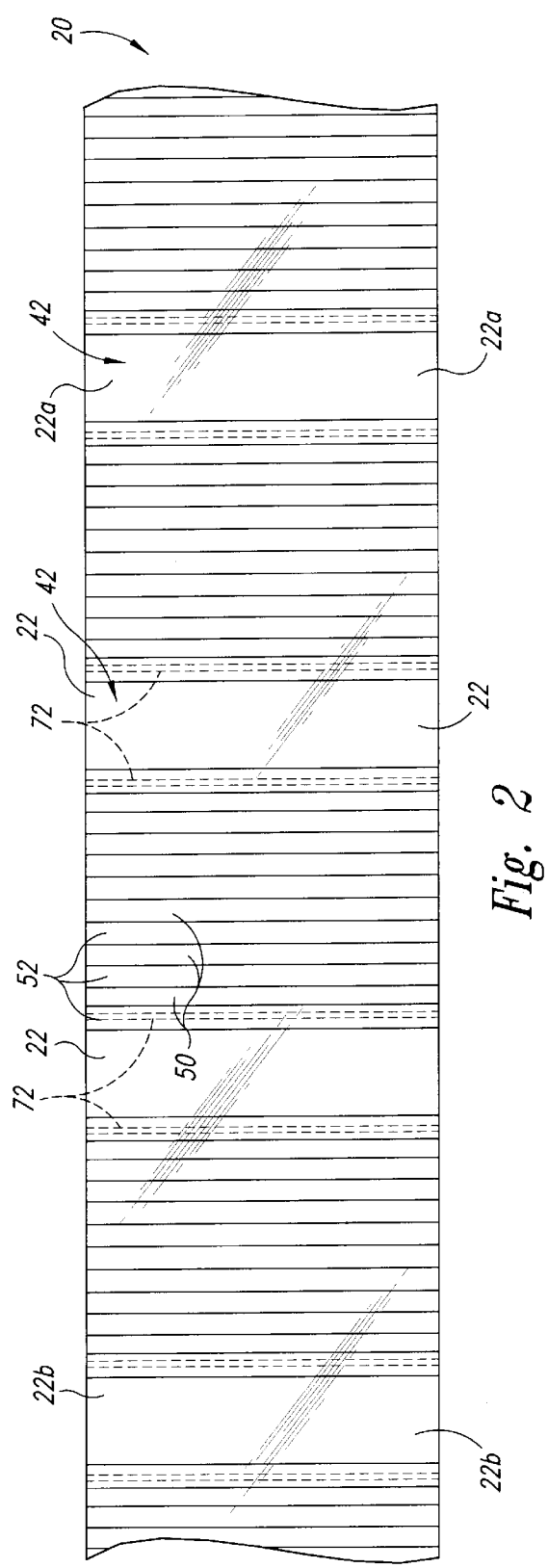

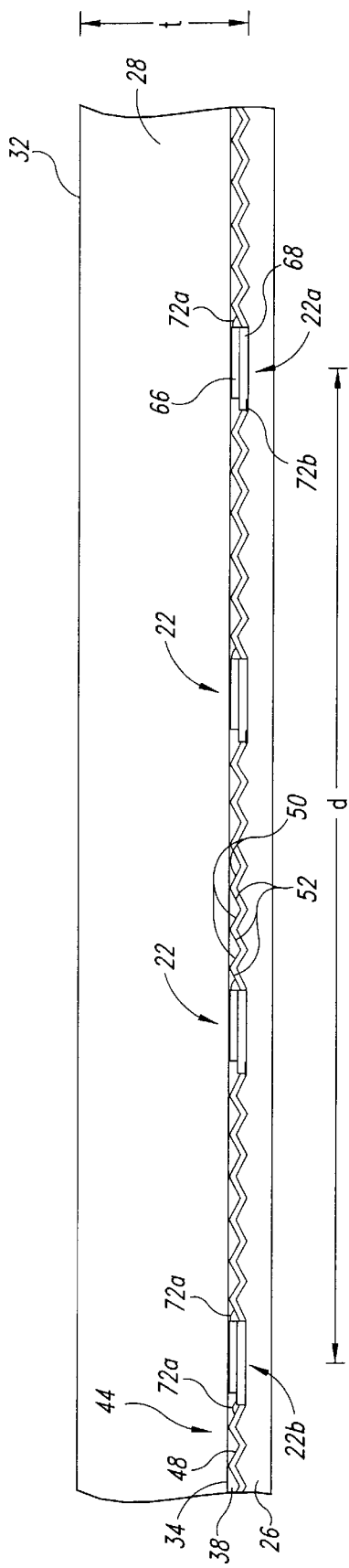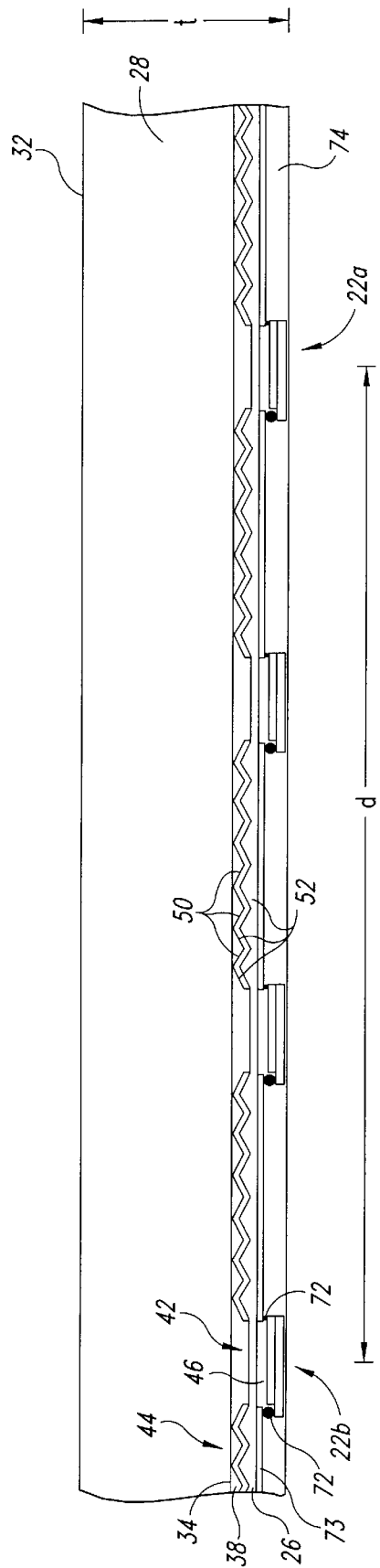

REFLECTIVE CONCENTRATING SOLAR CELL ASSEMBLY

TECHNICAL FIELD

The present invention is directed toward solar cell assemblies and more particularly toward a reflective concentrating solar cell assembly.

BACKGROUND OF THE INVENTION

Photovoltaic solar cells are used to generate electricity from impinging radiation such as solar radiation. Solar cells are typically formed from semiconductors such as silicon, amorphous silicon, cadmium telluride, gallium arsenide and copper indium diselinide. When subjected to impinging radiation, cells comprised of the above semiconductor materials generate an electric current.

One problem with semiconductor solar cells is that the materials comprising the solar cells are typically expensive. As a result, it is difficult to generate electricity with solar cells which is competitively priced with electricity generated by other means, such as hydroelectric power or fossil-fuel combustion. One approach to reducing the costs of semiconductor solar cells has been to make the cells extremely thin, thereby reducing the amount of material required to form each cell. Another method for improving the efficiency of semiconductor solar cells has been to use refractive lenses to focus radiation on the cell, thereby reducing the cell surface area required to receive a given amount of radiation. Such a method and associated device are disclosed in U.S. Pat. No. 5,437,736 to Cole.

One drawback with the conventional methods and devices described above is that the lenses used to focus incoming radiation are typically bulky and nonuniform, resulting in solar cell assemblies which are difficult to handle and which collect dirt and other debris, thereby reducing the efficiency of the solar cells. A further disadvantage of the devices described above is that separate semiconductor solar cells must be electrically coupled to generate electrical current sufficient for typical applications. Electrically coupling the separate solar cells requires the use of additional materials and process steps, thereby increasing the cost of the solar cell assembly.

One approach to addressing the foregoing drawbacks has been to use reflection rather than refraction to direct incident radiation toward the solar cells. U.S. Pat. No. 5,288,337, to Mitchell, discloses a photovoltaic module having a concave lower surface which directs radiation by total internal reflection toward adjacent solar cells. U.S. Pat. No. 4,235,643, to Amick and U.S. Pat. No. 4,313,023, to Stephens, disclose facets which direct radiation by total internal reflection toward an array of circular solar cells. U.S. Pat. No. 4,162,928, to Shepard, Jr., discloses a plate having a regular pattern of uniform indentations which reflect radiation toward a solar cell. U.S. Pat. No. 3,973,994 to Redfield discloses a solar cell having a grooved lower surface which reflects radiation by total internal reflection back and forth between upper and lower surfaces of the solar cell. One drawback of the foregoing devices and methods is that they do not efficiently collect incident radiation and direct the radiation to solar cells. Accordingly, the foregoing methods and devices require a relatively large solar cell surface area to receive a given amount of incident radiation.

SUMMARY OF THE INVENTION

The present invention embodies a method and apparatus for reflectively focusing radiation on solar cells. A solar cell assembly under one embodiment of the invention includes a reflective member having first and second opposite surfaces. The first surface is at least partially transparent and the second surface has a plurality of reflective portions positioned to receive radiation passing through the first surface of the reflective member and focus and reflect the radiation to form focused radiation. The focused radiation is directed toward the first surface at an angle relative to the first surface greater than a critical angle of the first surface. The first surface is positioned to direct the focused radiation away therefrom, such that the focused radiation converges as it moves away from the first surface. The assembly further comprises a solar cell positioned at least proximate to the reflective member. The solar cell has a radiation receiving surface positioned to receive the focused radiation directed away from the first surface of the reflective member and generate an electrical current therefrom.

In another embodiment of the invention, the reflective member comprises a support layer having first and second opposite surfaces, the first surface of the reflective member comprising the second surface of the support layer. The reflective member further comprises a film layer having first and second opposite surfaces, the first surface of the film layer being affixed to the first surface of the support layer. The second surface of the reflective member comprises the second surface of the film layer. Each reflective portion of the reflective member includes a reflective metallic layer positioned to direct a portion of the focused radiation through the film layer and through the support layer toward the second surface of the support layer, without striking another reflective portion.

In another embodiment of the invention, the solar cell is a first solar cell. the plurality of reflective portions is a first plurality, the radiation comprises a first radiation portion, and the focused radiation beam is a first focused radiation portion. The assembly further comprises a second plurality of reflective portions which are positioned to receive a second radiation portion passing through the first surface of the reflective member. The second reflective portions focus and reflect the second radiation portion to form a second focused radiation portion directed toward the first surface at an angle relative to the first surface greater than a critical angle thereof. The first surface is positioned to direct the second focused radiation portion away from the first surface by total internal reflection, such that radiation of the second focused radiation portion converges as it moves away from the first surface. A second solar cell is positioned at least proximate to the reflective member to receive the second focused radiation portion.

In yet another embodiment of the invention, the solar cell of the assembly is a first solar cell and the radiation comprises a first radiation portion. The assembly further comprises second, third and fourth solar cells. The plurality of reflective portions includes a first reflective portion positioned to reflect the first portion of radiation toward the first solar cell and a second reflective portion facing opposite the first reflective portion and positioned to reflect a second portion of radiation toward the second solar cell. The assembly further comprises a third reflective portion positioned intermediate the first and second reflective portions to reflect a third portion of radiation toward the third solar cell, and a fourth reflective portion positioned opposite the third reflective portion to reflect the fourth portion of radiation toward the fourth solar cell. The first, second, third and fourth reflective portions each have a triangular shape and are joined at a common point to form a pyramidal reflective element.

BRIEF DESCRIPTION OF THE DRAWINGS

FIG. 1 is a side elevation view of a solar cell assembly in accordance with an embodiment of the present invention.

FIG. 2 is a top plan view of the solar cell assembly shown in FIG. 1.

FIG. 5 is a side elevation view of a second alternate embodiment of the solar cell assembly shown in FIG. 1 in which a film layer comprising the reflective member has an inverted orientation.

FIG. 6 is a side elevation view of a third alternate embodiment of the solar cell assembly in which a film layer comprising the reflective member includes two conductive layers.

DETAILED DESCRIPTION OF THE INVENTION

Figure 3:
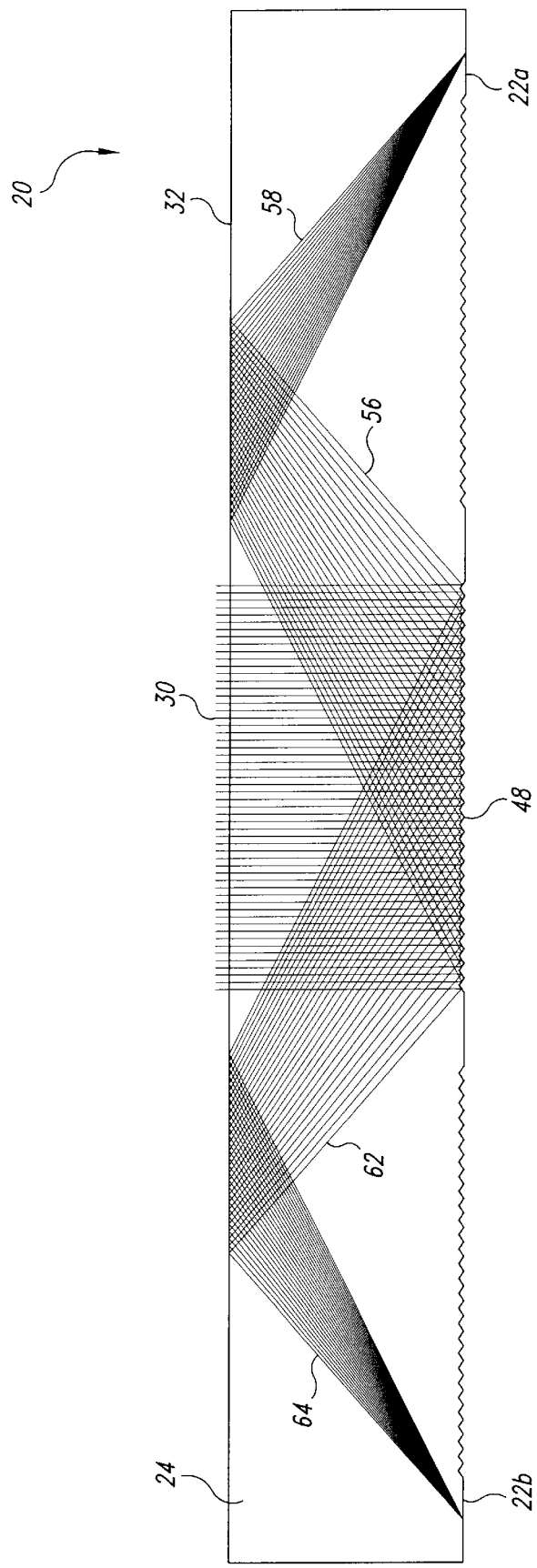
FIG. 3 is an illustration of a computer generated ray trace calculation for a solar cell assembly in accordance with the embodiment of FIG. 1.

The high cost element of all photovoltaic power systems remains conversion panels or photovoltaic modules or cells. Current industry standards include modules made from single crystal silicon wafers. Photovoltaic power systems utilizing silicon modules generate electricity at costs far above the costs associated with fossilfuel energy sources. The high price of these modules is directly related to the high cost of single crystal silicon. To reduce costs, the silicon must either be better utilized or replaced with a lower-cost alternative. To date, two separate technology approaches have been developed to address the cost problem: concentration and thin film materials.

Concentration reduces the material cost by substituting mirrors and lenses to focus incoming radiation. One example of refractive focusing is disclosed by U.S. Pat. No. 5,437,736, to Cole, incorporated herein by reference. The focused radiation can be absorbed by a solar cell having less surface area than a similar cell positioned to absorb non-focused radiation. By focusing the incoming radiation, the amount of solar cell area required to receive the radiation is reduced, thereby reducing the total amount of solar cell material required.

Thin film materials absorb sunlight but have only $\frac{1}{50}$ the thickness of silicon wafers. This represents a significant savings in material volume and therefore material costs. Demonstrated semiconductors include amorphous silicon, cadmium telluride, and copper indium diselinide. Thin film materials are fabricated using any number of known vacuum deposition techniques, including chemical vapor, sputtering, and coevaporation. Modules are typically formed on glass sheets or thin flexible substrates where series cell interconnection is handled as a part of the process. Unfortunately, these materials are inefficient at collecting solar radiation and therefore require large surface areas, and hence increased material costs for adequate solar power generation.

The present invention solves several problems inherent with both concentration and thin film materials. Since thin film materials are the starting material, material cost is low, and high levels of concentration are not necessary to further reduce cell material costs. By using a low level of concentration, approximately 5×, approximately $\frac{1}{5}$ the thin material is required to achieve the same efficiency as a system having no concentration. Concentration is achieved in embodiments of the present invention by reflectively focusing radiation toward the thin film solar cell.

A solar cell assembly, and in particular, an apparatus and method for directing incident radiation by total internal reflection toward a solar cell, is described in detail herein. In the following description, numerous specific details are set forth such as specific materials, specific geometric relationships, etc. in order to provide a thorough understanding of the present invention. One skilled in the relevant art, however, will recognize that the present invention can be practiced without one or more of the specific details, or with other geometric relationships, methods, etc. In other instances, well known structures or operations are not shown in detail in order to avoid obscuring the present invention.

FIG. 1 is a side view of an embodiment of a solar cell assembly 20 in accordance with aspects of the present invention. FIG. 2 is a top plan view of the solar cell assembly 20 shown in FIG. 1. Referring to FIGS. 1 and 2, the solar cell assembly 20 comprises a plurality of solar cells 22 attached to a reflective member 24. In one embodiment, the reflective member 24 comprises a thin, flexible lower film layer 26 to which the solar cells 22 are attached and an upper support layer 28 which adds structural support to the film layer 26. Incident radiation 30, shown schematically in dashed lines in FIG. 1, passes through the support layer 28 and the film layer 26 and is internally reflected and focused toward the solar cells 22 as discussed in greater detail below. The incident radiation 30 may comprise visible or non-visible radiation, depending upon the characteristics of the solar cells 22 on which the radiation is focused. By focusing the incident radiation 30, the solar cell assembly 20 may increase the efficiency with which the solar cells 22 convert the radiation to electrical current, and may reduce the size of the solar cells necessary to convert a given amount of radiation. For purposes of illustration, only a portion of the total radiation incident upon the solar cell assembly 20 is shown in FIG. 1.

The support layer 28 includes an upper surface 32 facing toward the incident radiation 30 and an opposite facing lower surface 34. The support layer 28 is transparent to permit the incident radiation 30 to pass therethrough. In one embodiment, the support layer 28 has a thickness $t_1$ of approximately 4 millimeters and is at least partially rigid to both support the film layer 26, and substantially prevent the film layer from flexing. By substantially preventing the film layer 26 from flexing, the likelihood that the solar cells 22 will separate from the film layer is greatly reduced, and the reflective properties of the assembly 20 remain substantially fixed. The support layer 28 may comprise glass or acrylic, or comprise other substantially transparent and rigid materials in alternate embodiments.

The support layer 28 is attached with an adhesive layer 36 to the film layer 26. The film layer 26 is positioned to reflect the incident radiation 30 by total internal reflection, as discussed in greater detail below. The film layer 26 has an upper surface 38 facing the support layer 28, and a lower surface 40 facing opposite the upper surface 38. The adhesive layer 36 is positioned between the upper surface 38 of the film layer 26 and the lower surface 34 of the support layer 28 to bond the support layer to the film layer. In one embodiment, the film layer 26 comprises a shaped or molded acrylic decal and may comprise other transparent materials in other embodiments. In one embodiment, the film layer 26 has a thickness $t_2$ of 0.5 millimeters, and other embodiments have film layers with larger or smaller thicknesses, as discussed below. The adhesive layer 36 may be transparent to permit the incident radiation 30 to pass from the support layer 28 to the film layer 26. In one embodiment, the indices of refraction of the support layer 28, adhesive layer 36, and film layer 26 are approximately the same so as to reduce the likelihood that radiation will be reflected at any of the interfaces between the support layer, adhesive layer, and film layer.

The lower surface 40 of the film layer 26 includes a plurality of spaced apart transparent regions 42. The solar cells 22 are bonded or otherwise secured to the transparent regions 42 to receive light passing through the film layer 26 and generate electrical current therefrom. In the embodiment shown in FIGS. 1 and 2, the solar cells 22 are elongated and spaced apart parallel to each other beneath the transparent regions 42. The solar cells 22 are preferably bonded to the transparent regions 42 by adhesive strips 46. The adhesive strips 46 may have an index of refraction identical to or nearly identical to an index of refraction of the film layer 26 to reduce the likelihood of reflection of the interface therebetween.

Opaque regions 44 are positioned on the lower surface 40 of the film layer 26 between each transparent region 42. In an exemplary embodiment, the opaque regions 44 are made opaque by the presence of a reflective layer 48 which coats the lower surface 40 in the opaque regions thereof. The reflective layer 48 may comprise metallic materials or other reflective materials. As is best seen in FIG. 1, the opaque regions 44 are shaped to form a series of alternating first reflective portions 50 sloping downwardly from left to right, and second reflective portions 52 adjacent thereto which slope downwardly from right to left. The reflective portions 50 and 52 form reflective facets in the lower surface 40 of the film layer 26 which reflect the incident radiation 30 toward the solar cells 22, as discussed below.

The first reflective portions 50 are oriented to receive and reflect first radiation portions 54. The first radiation portions 54 pass through the support layer 28 and the film layer 26 and are reflected by the first reflective portions 50 back toward the upper surface 32 of the support layer 28, forming first reflected radiation portions 56. The first reflective portions 50 are oriented to direct the first reflected radiation portions 56 toward each other, thereby focusing the first reflected radiation portions as they approach the upper surface 32 of the support layer 28. The first reflective portions 50 are also positioned such that the first reflected radiation portions 56 strike the upper surface 32 at greater than the critical angle of the upper surface. As used herein, the critical angle refers to the minimum angle at which radiation which is passing from a first medium toward a second medium is reflected at the boundary between the media back into the first medium. Total internal reflection refers to the resulting reflection. Accordingly, the first reflected radiation portions 56 are reflected by total internal reflection at the upper surface 32, forming first redirected radiation portions 58 which are directed toward a first solar cell 22a.

The second reflective portions 52 are positioned between each first reflective portion 50. The second reflective portions 52 are positioned to receive second radiation portions 60 and reflect the second radiation portions toward the upper surface 32 of the support layer 28, forming second reflected radiation portions 62. At the upper surface 32, the second reflected radiation portions 62 are redirected by total internal reflection toward a second solar cell 22b, forming second redirected radiation portions 64.

In one embodiment, adjacent first reflective portions 50 are canted toward each other. Accordingly, the first reflected radiation portions 56 are at least partially focused as they approach the upper surface 32 of the support layer 28. The upper surface 32 reflects the first reflected radiation portions 56 so that the first redirected radiation portions continue to converge and focus as they move away from the upper surface toward the first solar cell 22a. In a similar fashion, adjacent second reflective portions 52 may be canted toward each other to focus the second reflected radiation portions 62. In the embodiment shown in FIGS. 1 and 2, six first reflective portions 50 and six second reflective portions 52 are positioned between each solar cell 22 for purposes of illustration. In other embodiments, a greater or lesser number of reflective portions may be positioned between the solar cells 22, as will be shown in FIG. 3.

In a further aspect of the embodiment shown in FIGS. 1 and 2, the first and second reflective portions 50 and 52 are positioned and oriented so that radiation reflected from the first reflective portions 50 does not strike the second reflective portions 52 and vice versa. Accordingly, the first and second reflective portions 50 and 52 do not create shadows or otherwise block radiation from passing to the solar cells 22a and 22b, respectively.

As shown in FIG. 1, the first reflective portions 50 have an angle $\alpha_1$ with respect to the upper surface 32 of the support layer 28 and the second reflective portions have an angle $\alpha_2$ with respect to the upper surface. The first and second solar cells 22a and 22b are separated by a distance d and the solar cells 22 are separated from the upper surface 32 of the support layer by a distance t, which comprises $t_1$, the thickness of the support layer 28, and $t_2$, the thickness of the film layer 26. The angles $\alpha_1$ and $\alpha_2$, distance d and thickness t are related by the following two equations:

$$d = 2t/\tan(90° - 2\alpha_1) \qquad (1)$$

$$2d = 2t/\tan(90° - 2\alpha_2) \qquad (2)$$

The above equations may be solved simultaneously to determine $\alpha_2$ as a function of $\alpha_1$ to produce the following equation:

$$\alpha_2 = \tfrac{1}{2}(90 - a\, \tan(\tfrac{1}{2} \tan(90° - 2\alpha_1))) \qquad (3)$$

Equation (3) may then be solved to produce a range of values for $\alpha_2$ corresponding to a range of values for $\alpha_1$. The minimum value for $\alpha_1$ is one-half the critical angle at the upper surface 32. The critical angle is a material-dependent angle for internal reflection, which is approximately 42° for acrylic. By substituting the resulting ranges into equations (1) and (2), the separation distance d is found to range from 1.8t to 2.22t for a reflective member 24 having a critical angle of 42°. For other materials having higher indices of refraction, the range may be broadened to 1.0t to 2.22t.

FIG. 3 is an illustration of a computer generated ray trace calculation, based on the above equations and assuming a critical angle of 42°. As seen in FIG. 3, the first and second reflective portions reflect the incoming radiation 30 to impinge on the first and second solar cells 22a and 22b. Radiation reflected at the reflective layer 48 passes unobstructed to the upper surface 32 of the reflective member 24 and back to the solar cells 22a and 22b.

In one embodiment, the solar cells 22 are thin film solar cells, comprising a thin film portion 66 mounted to a substrate 68, as shown in FIG. 1. The thin film portion 66 includes a radiation receiving surface 70 which receives incoming radiation in the form of direct radiation portions 71, and reflected radiation portions as discussed above. In alternate embodiments, the solar cells 22 comprise solar cells other than thin film solar cells, which are also capable of receiving incident radiation and generating an electric current therefrom. Such alternate embodiments may require adjusting the spacing of the solar cells and angles of the reflective portions. In further alternate embodiments, the solar cells 22 need not be affixed directly to the film layer 26 but rather may be positioned proximate to a surface of the reflective member 24, so long as radiation passing out of the reflective member and toward the solar cells does so at an angle which is less than the critical angle of the relevant reflective member surface. Accordingly, the radiation passes out through the relevant surface of the reflective member 24 to the solar cells 22 rather than reflecting within the reflective member. In yet another alternative embodiment, the solar cells 22 are affixed directly to the lower surface 34 of the support layer 28. In this alternate embodiment, the film layer 26 comprises a plurality of strips affixed to the lower surface 34 between the solar cells 22, rather than a single continuous sheet. Accordingly, the strips may be laid parallel to each other between the solar cells 22 to form solar cell assemblies having a wide range of overall widths. This alternate embodiment is advantageous because it permits the manufacture of solar cell assemblies 20 which are not limited in size by the width of the film layer 26.

In one embodiment, adjacent solar cells 22 may be electrically coupled by connecting the thin film portion 66 and substrate 68 of each solar cell to the reflective layer 48 with conductive contacts 72. Accordingly, the reflective layer 48 can comprise an electrically conductive material. The reflective layer 48 has gaps at the transparent regions 42 so that current is directed in series through each solar cell 22. Other circuit arrangements are used in other embodiments. The conductive contacts 72 may comprise continuous conductive beads, as is best seen in plan view in FIG. 2 or alternatively may comprise intermittent bead portions (not shown). The conductive contacts 72 are formed from solder or other conductive materials known to those skilled in the art which electrically couple adjacent solar cells 22 via the reflective layer 48 positioned between each pair of solar cells. Accordingly, the reflective layer 48, which serves to reflect and focus incident radiation, serves the dual purpose of electrically coupling the solar cells 22 which would otherwise require a separate, parasitic means for electrical coupling.

In one embodiment, a layer of backing material 74 may be positioned against the reflective layer 48 and solar cells 22. The backing material layer 74 protects the solar cells 22 and reflective layer 48 from incidental contact with potentially harmful objects during shipment and installation of the solar cell assembly 20. The backing material 74 may comprise a resilient material which may be easily bonded to the solar cells 22 and reflective layer 48. In one embodiment, the solar cells 22 and backing material 74 may comprise an integral structure which is adhesively bonded to the film layer 26 with the adhesive strips 46. Additional adhesive may be used to adhere the backing material to the reflective layer 48.

One advantage of an embodiment of the solar cell assembly 20 shown in FIGS. 1 and 2 is that the first and second reflective portions 50 and 52 are oriented to focus incident radiation on the first and second solar cells 22a and 22b, respectively. Accordingly, the size of the first and second solar cells 22a and 22b may be reduced, reducing the amount of typically expensive solar cell material required to receive a given amount of incident radiation. A further advantage of an embodiment of the solar cell assembly 20 is that the upper surface 32 of the support layer 28 redirects the reflected radiation portions 56 and 62 in the form of redirected radiation portions 58 and 64 which continue to focus as they approach the solar cells 22a and 22b, respectively. The additional concentration of the reflected radiation portions is accomplished with a flat upper surface 32 rather than a contoured upper surface. Accordingly, yet a further advantage of an embodiment of the solar cell assembly 20 is that the flat upper surface 32, unlike a contoured upper surface, does not tend to collect dust, debris and other contaminants which block incident radiation and reduce the effectiveness of the solar cell assembly. Furthermore, any dust or debris which may incidentally collect on the cell upper surface is more easily removed from a flat upper surface than from a contoured upper surface.

Still a further advantage of an embodiment of the solar cell assembly 20 shown in FIGS. 1 and 2 is that the reflective layer 48 serves the dual purpose of reflecting and focusing incident radiation upon the solar cells 20 while at the same time providing an electrical coupling between the solar cells. The reflective layer 48 therefore eliminates the need for any additional electrical coupling between the solar cells 22.

Figure 4:
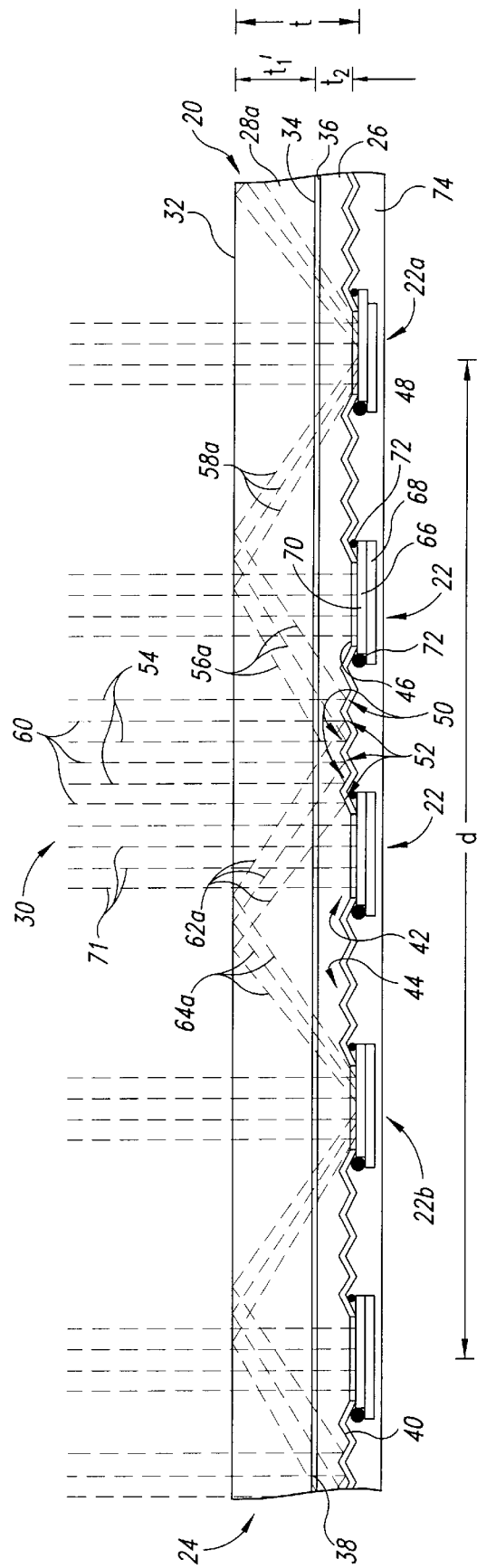
FIG. 4 is a side elevation view of a first alternate embodiment of the solar cell assembly shown in FIG. 1 in which a thickness of a reflective member comprising the assembly is selected to focus incoming radiation by a selected amount.

FIG. 4 is a side elevation view of a first alternate embodiment of the solar cell assembly 20 shown in FIGS. 1 and 2. The solar cell assembly 20 shown in FIG. 4 is substantially similar to the solar cell assembly shown in FIGS. 1 and 2, and elements in FIG. 4 and in the other drawings for other alternative embodiments will be similarly numbered when of similar construction. Only the differences in construction will be described in detail.

As shown in FIG. 4, a thickness $t_1'$ of the support layer 28a is reduced relative to a thickness $t_1$ of the support layer 28 shown in FIG. 1. As a result, the first and second reflected radiation portions 56a and 64a are less focused by the time they reach the upper surface 32 than are the corresponding first and second reflected radiation portions 56 and 62 shown in FIG. 1. Accordingly, the first and second redirected radiation portions 58a and 64a are also not as sharply focused when they reach the first and second solar cells 22a and 22b, respectively. The thickness $t_1'$ of the support layer 28a may be deliberately chosen to focus the incident radiation 30 less sharply on the solar cells 22a and 22b when compared with the support layers 28 shown in FIG. 1.

An advantage of the solar cell assembly 20 shown in FIG. 4 is that the thickness of the support layer 28a may be selected to focus the incident radiation 30 by a desired amount. This capability is advantageous because it may be desirable to focus the incident radiation less sharply in some cases than in others. For example, where the solar assembly 20 is mounted to a tracking mechanism to track the movement of the sun during the day, it may be advantageous to focus the radiation on the solar cells somewhat less accurately, to account for tracking mechanism inaccuracies. Accordingly, if the tracking mechanism does not accurately track the movement of the sun, at least a portion of the incident radiation will still strike the solar cell 22, despite the tracking inaccuracies. Where the solar assembly may be consistently positioned relative to the incident radiation 30, it may be desirable to sharply focus the incident radiation, as shown in FIGS. 1–3, to reduce the amount of solar cell material required to collect a given amount of radiation.

FIG. 5 is a side elevation view of a second alternative embodiment of a solar cell assembly 20 having a film layer 26 inverted when compared to the film layer shown in FIGS. 1 and 2. For purposes of clarity, the radiation shown schematically in FIG. 1 has been eliminated from FIG. 5; however, the solar cell assembly 20 shown in FIG. 5 operates in substantially the same fashion as the assembly shown in FIG. 1, as is discussed below.

As shown in FIG. 5, the film layer 26 is positioned adjacent the support layer 28 such that the reflective layer 48 is adjacent the lower surface 34 of the support layer. The film layer 26 is bonded to the support layer 28 with the adhesive layer 38. As shown in FIG. 5, the adhesive layer 38 completely fills any gaps between the reflective layer 48 and the lower surface 34 to reduce the potential for any reflections at the interface between the film layer 26 and the support layer 28. The solar cells 22a and 22b are positioned between the opaque regions 44 to receive radiation reflected from the first and second reflective portions 50 and 52, respectively. In one embodiment, the reflective layer 48 is electrically conductive and the solar cells are electrically coupled to the reflective layer with wires or tabs 72a. In another embodiment, the substrate 68 of the solar cell 22 may be bonded directly to the reflective layer 48 at a bond site 72b. In other embodiments, other connection means may be used to couple the solar cells 22 to the reflective layer 48.

FIG. 6 is a side elevation view of a third alternate embodiment of a solar cell assembly 20 having an inverted film layer 26. The solar cell assembly 20 shown in FIG. 6 is similar to the assembly shown in FIG. 5, except that the solar cells 22 are positioned external to the film layer 26 rather than sandwiched between the film layer and the support layer 28. The film layer 26 shown in FIG. 6 accordingly includes a conductive layer 73, opposite the reflective layer 48, to which the solar cells 22 are electrically coupled in a manner similar to that discussed above with reference to FIGS. 1 and 2. The backing material 74 may be provided to protect the solar cells 22 and, as discussed previously, may be formed integrally with the solar cells.

One advantage of the solar cell assemblies 20 shown in FIGS. 5 and 6 is that the radiation incident to the assemblies does not pass through the film layer 26, but rather is reflected immediately upon striking the film layer. Accordingly, the film layer 26 need not comprise materials having highly refined optical characteristics, and may instead comprise cheaper materials, reducing the overall cost of the solar cell assembly.

Figure 7:
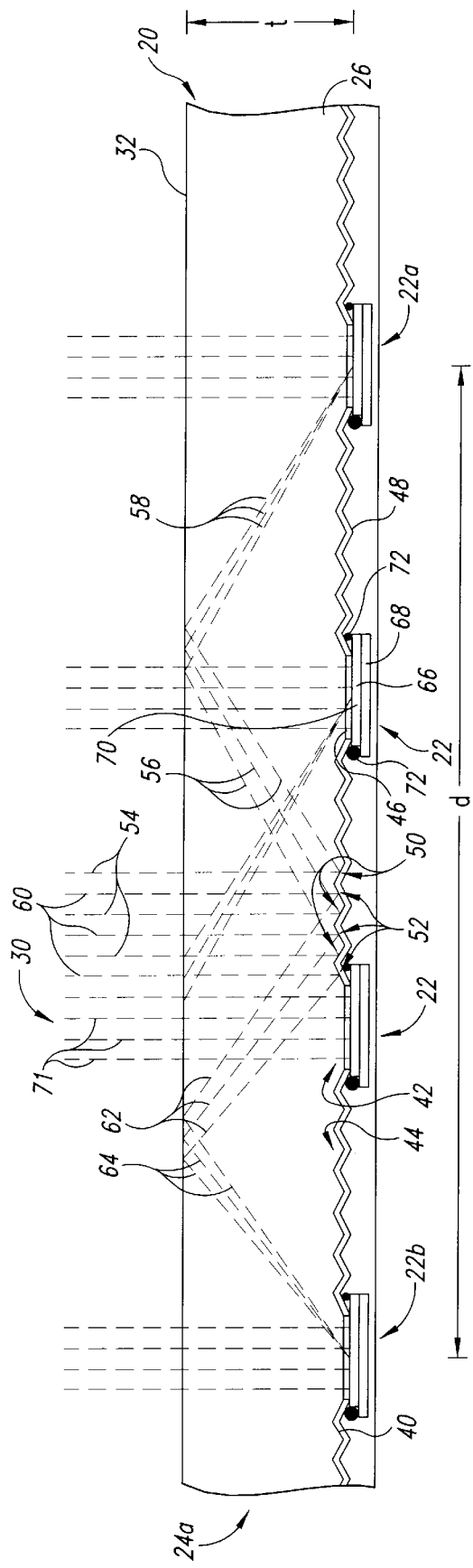
FIG. 7 is a side elevation view of a fourth alternate embodiment of a solar cell assembly in accordance with the present invention in which a reflective member of the assembly comprises a single member.

FIG. 7 is a side elevation view of a fourth alternate embodiment of a solar cell assembly in accordance with the present invention. As shown in FIG. 7, the reflective member 24a comprises a single unit rather than a composite of a support layer and film layer. The reflective member 24a may comprise acrylic, glass, or other transparent rigid materials which are relatively inexpensive and which have indices of refraction which permit the reflective member 24a to reflect, focus, and redirect incident radiation in a manner substantially similar to that discussed previously with reference to FIGS. 1 and 2.

The first and second reflective portions 50 and 52 are preferably either machined into the lower surface 40 of the reflective member 24a, or the reflective member may be cast or molded with the reflective portions formed directly in the lower surface thereof. The solar cells 22 and reflective layer 48 are then bonded to the lower surface 40 in a manner substantially similar to that discussed previously with respect to FIGS. 1 and 2.

An advantage of the solar cell assembly 20 shown in FIG. 7, when compared with the assembly shown in FIGS. 1 and 2, is that the reflective member 24a comprises a single unit. The single unit reflective member 24a accordingly reduces the number of manufacturing steps required to form the reflective member, and reduces the potential for undesirable reflections at the interfaces between components comprising the reflective member. Conversely, an advantage of the solar cell assembly 20 shown in FIGS. 1 and 2 when compared to the assembly shown in FIG. 7, is that it may be cheaper to form the reflective portions 50 and 52 in a thin film layer 26 than it is to machine or otherwise form the reflective portions directly into the reflective member 24a.

Figure 8:
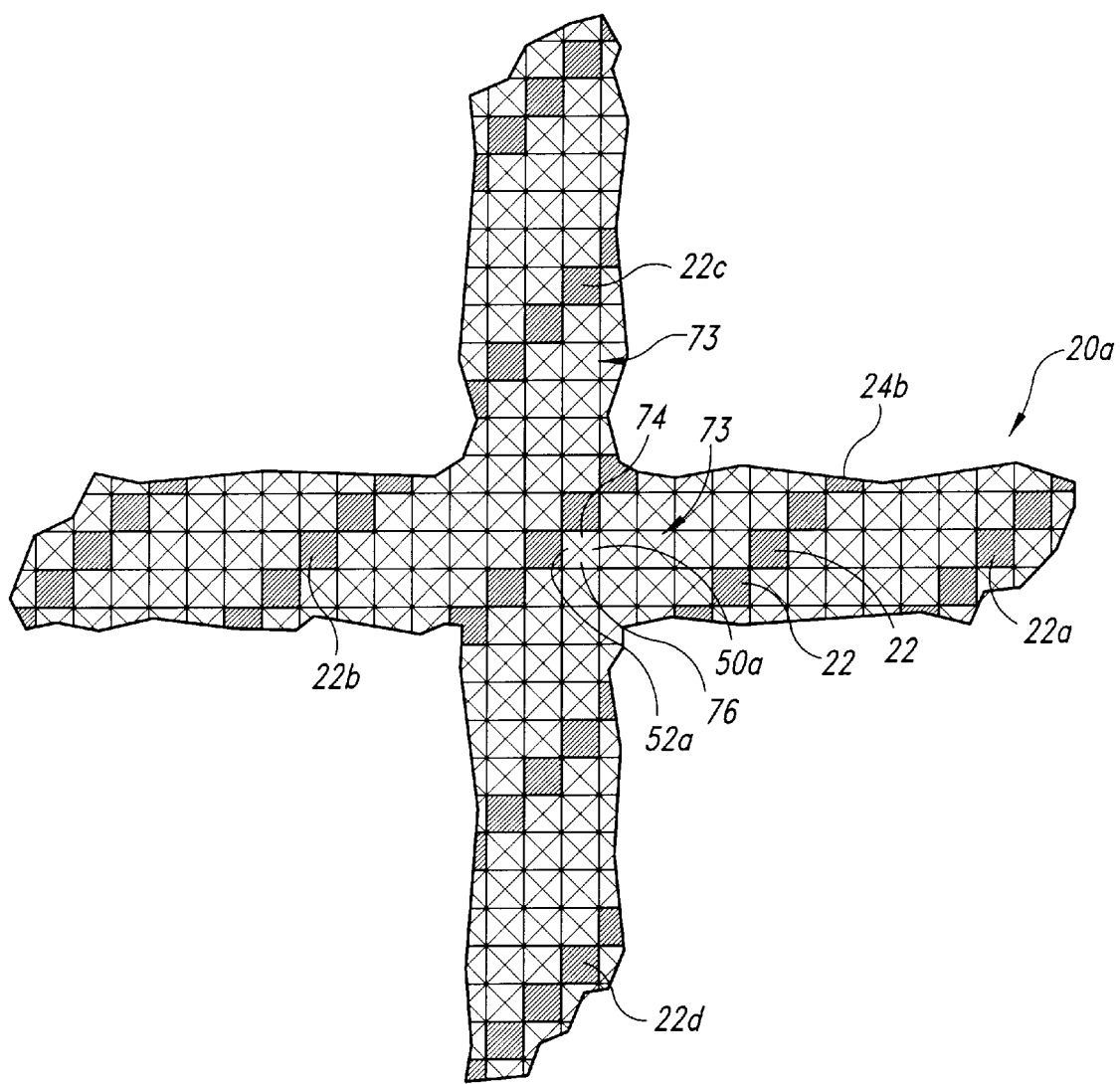
FIG. 8 is a plan view of a portion of a fifth alternate embodiment of a solar cell assembly having a two-dimensional pattern of solar cells.
Figure 9:
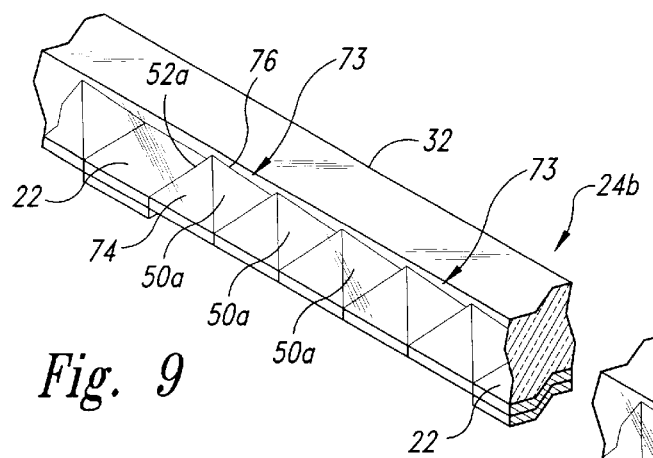
FIG. 9 is an enlarged isometric view of a portion of the solar cell assembly shown in FIG. 8.

FIG. 8 is a plan view of a portion of a fifth embodiment of a solar cell assembly 20a having a two-dimensional pattern of solar cells 22. FIG. 9 is an enlarged isometric view of a portion of the solar cell assembly 20a shown in FIG. 8. Referring to FIGS. 8 and 9, the solar cell assembly 20a comprises a reflective member 24b. For purposes of illustration, the reflective member 24b is shown as a single unit, similar in construction to the reflective member 24a shown in FIG. 7. In other embodiments, the reflective member 24b may comprise a composite of a support layer and a film layer in a manner similar to that shown in FIGS. 1 and 2.

The reflective member 24b includes a plurality of reflector elements 73. Each reflector element 73 has an upwardly extending four-sided pyramidal shape having first and second reflective portions 50a and 52a, and third and fourth reflective portions 74 and 76. The first and second reflective portions 50a and 52a are positioned to reflect incident radiation, by total internal reflection, toward the first and second solar cells 22a and 22b, respectively. Incident radiation striking the first and second reflective portions 50a and 52a is reflected at the upper surface 32 of the reflective member 24b toward the respective solar cells 22a and 22b. In a like manner, incident radiation striking the third and fourth reflective portions 74 and 76 is directed by total internal reflection toward third and fourth solar cells, 22c and 22d, respectively. For purposes of clarity, electrical connections between the solar cells 22 are not shown in FIGS. 7 and 8; however, the solar cells may be electrically coupled using any of the methods previously discussed.

The first reflective portions 50a of adjacent reflective elements 73 are canted toward each other to focus incident radiation on the solar cell 22a in a manner similar to that discussed previously with reference to FIGS. 1 and 2. Similarly, the second reflective portions 52a of adjacent reflector elements 73 are also canted toward each other to focus incident radiation toward the second solar cell 22b. In like fashion, the third reflective portions 74 of adjacent reflective elements 73 are canted toward each other to focus incident radiation toward the third solar cell 22c, and the fourth reflective portions 76 of adjacent reflective portions 73 are canted toward each other to focus incident radiation on the fourth solar cell 22d. Furthermore, each reflective portion is oriented to direct incident radiation toward the respective solar cell without causing the radiation to impinge on a neighboring reflective portion. Interference or shadowing by neighboring reflective portions may accordingly be eliminated, increasing the efficiency of the solar cell assembly 20b.

In a preferred embodiment, groups of solar cells, each comprising a first, second, third and fourth solar cell 22a–d, are diagonally staggered with respect to each other such that only the corners of adjacent solar cells are actually adjacent. Accordingly, each solar cell 22 receives radiation from four directions. Therefore, an advantage of the solar cell assembly 20a shown in FIG. 6, when compared to the assembly 20 shown in FIG. 1, is that the solar cells 22 shown in FIG. 6 may have twice the efficiency of the solar cells shown in FIG. 1, which receive radiation from only two directions. The amount of solar cell material required to receive a given amount of incident radiation may accordingly be halved.

In an alternate embodiment (not shown), adjacent cells are not staggered so that each adjacent cell shares a side with its neighbor. The adjacent solar cells 22 form a grid of rows and columns, separated by reflector elements 73. In this alternate embodiment, each solar cell receives radiation from only two directions, in substantially the same fashion as discussed above with respect to FIGS. 1 and 2. The collection efficiency for this alternate embodiment is accordingly the same as the collection efficiency for solar cells shown in FIGS. 1 and 2 and half the efficiency for the solar cells shown in FIGS. 8 and 9.

Figure 10:
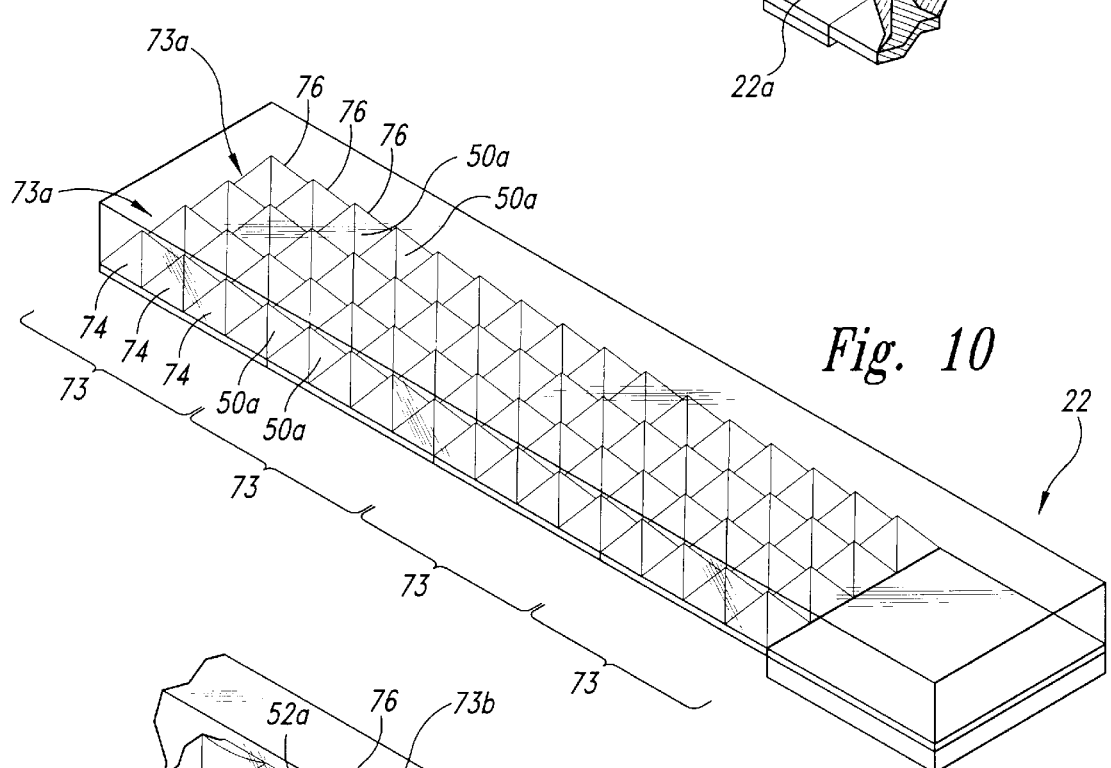
FIG. 10 is an enlarged isometric view of an alternate embodiment of the two-dimensional solar cell assembly shown in FIG. 8.

FIG. 10 is an enlarged isometric view of an alternate embodiment of the two-dimensional solar assembly 20a shown in FIG. 7. Each reflector element 73 of the reflective member 24b comprises a plurality of reflector subelements 73a. Each subelement 73a includes first, second, third, and fourth reflective portions 50a, 52a, 74 and 76, respectively, which reflect incident radiation to the respective solar cells in a manner similar to that described above with reference to FIGS. 8 and 9. An advantage of the reflector subelements 73a shown in FIG. 8 is that they may more accurately focus the incident radiation by individually focusing smaller portions of incident radiation as compared to the radiation portions focused by the reflector elements 73 shown in FIGS. 8 and 9.

Figure 11:
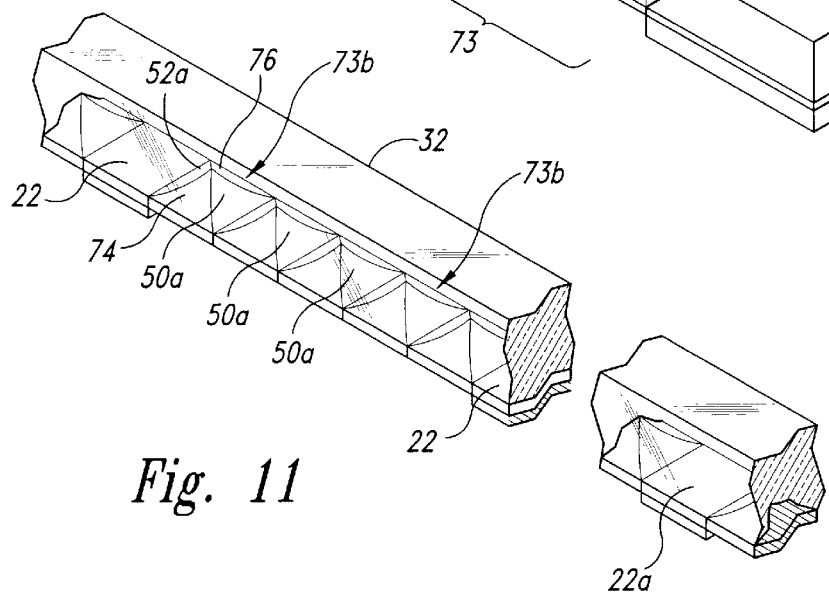
FIG. 11 is an enlarged isometric view of another alternate embodiment of the two-dimensional solar cell assembly shown in FIG. 8.

FIG. 11 is an enlarged isometric view of a portion of another alternate embodiment of the two-dimensional solar cell assembly 20a having curved reflector elements 73b. Each reflector element 73b has a four-sided pyramidal shape but the sides of the reflector element comprising the reflective portions 50a, 52a, 74 and 76 are curved rather than flat. The curved shape may be concave, as shown in FIG. 11, or convex in an alternate embodiment. Accordingly, an advantage of the reflector elements 73b is that the curved shape of the reflective portions may further focus the radiation reflected by the reflector elements. By increasing the degree to which the incident radiation is focused, the amount of solar cell material required to receive a given amount of incident radiation may be further reduced and the overall thickness of the solar cell assembly 20a may be reduced as well.

Figure 12:
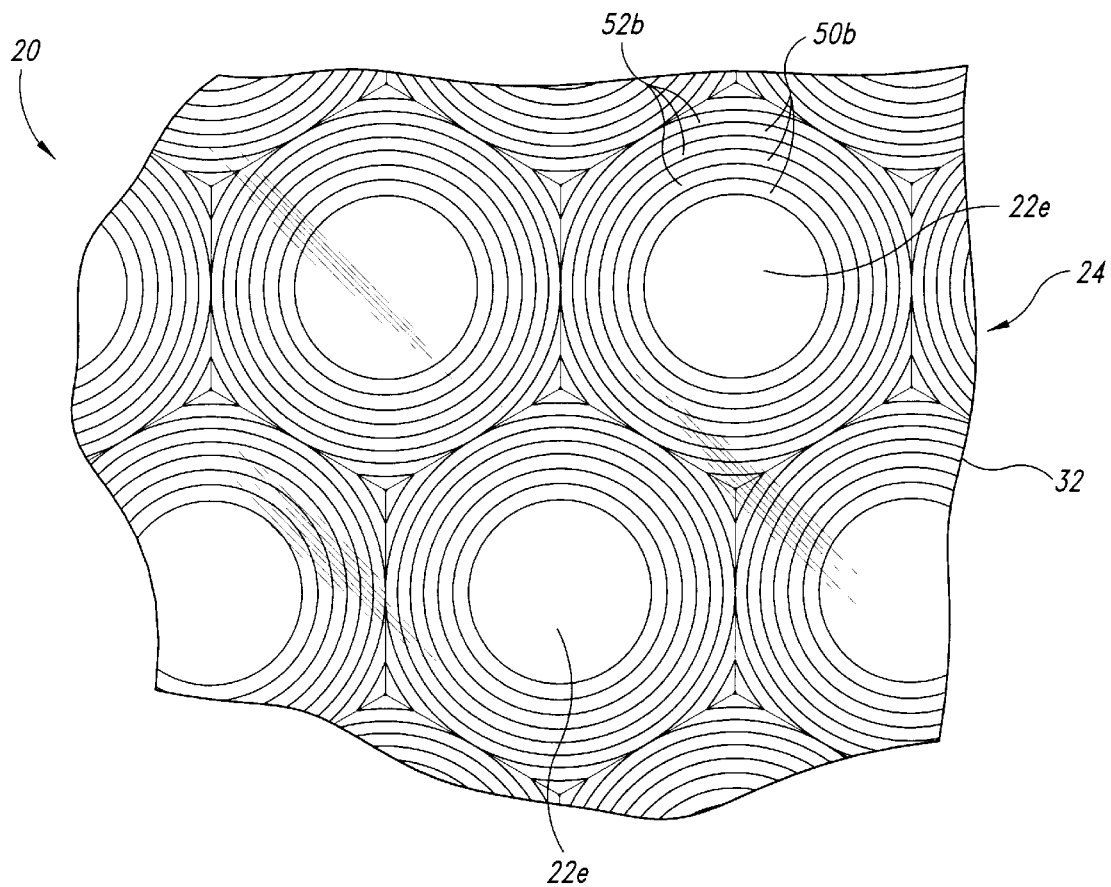
FIG. 12 is a plan view of a sixth alternate embodiment of a solar cell assembly in accordance with the present invention having circular solar cells and a concentrically arranged reflective portion.

As shown in FIGS. 8–11, the reflector elements 73 have four-sided pyramidal shapes. In alternate embodiments, the reflector elements may have other shapes, such as six-sided hexagonal shapes. In such embodiments, the solar cells 22 have corresponding hexagonal shapes and may be arranged relative to the reflector elements 73 in a staggered manner similar to that shown in FIG. 8. In further alternate embodiments, the solar cells may have other shapes. In one such alternate embodiment shown in FIG. 12, the solar cell assembly includes circular solar cells 22e. The first and second reflective portions 50b and 52b alternately and concentrically surround each solar cell 22e. The first and second reflective portions 50b and 52b, the spacing between the solar cells 22e, and the thickness of the reflective member 24 containing the first and second reflective portions are all selected to reflect, focus, and redirect incident radiation from the reflective portions to the upper surface 32 of the reflective member and back toward the solar cells 22e in substantially the same manner as discussed previously with reference to FIGS. 1 and 2.

Figure 13A:
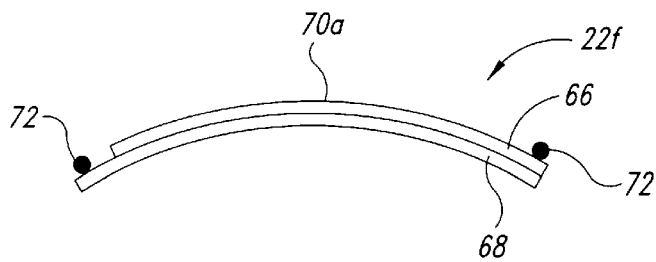
FIG. 13A is a side elevation view of an alternate embodiment of the solar cell shown in FIG. 1.
Figure 13B:
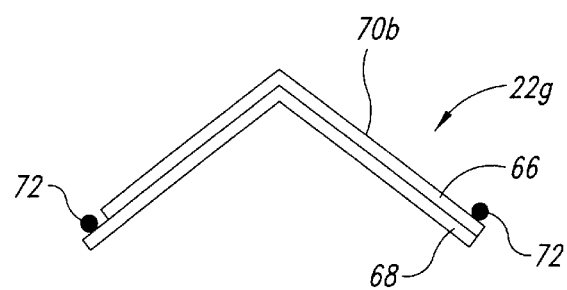
FIG. 13B is a side elevation view of another alternate embodiment of the solar cell shown in FIG. 1.
Figure 13C:
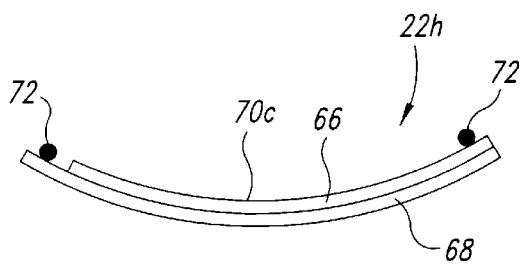
FIG. 13C is a side elevation view of yet another alternate embodiment of the solar cell shown in FIG. 1.

FIG. 13A is an alternate embodiment of a solar cell 22f shown in FIG. 1 having a convex receiving surface 70a. The convex receiving surface 70a is advantageous because it may more efficiently receive radiation impinging on the solar cell 22f from different directions than would the flat solar cell 22 shown in FIG. 1. Where impinging radiation is not accurately focused directly on the center of the solar cell, the curved shape of the receiving surface 70a may provide a larger amount of surface area, including area which is normal to the impinging radiation, thereby reducing the likelihood that the radiation will glance off the receiving surface (e.g., be received at an angle approximately equal to or greater than the critical angle of the receiving surface). Similarly, alternate solar cells 22g and 22h shown in FIGS. 13B and 13C have receiving surfaces 70b and 70c, respectively, shaped to receive radiation which may not be focused directly on the center of the respective solar cell. For example, the receiving surface 70c of the solar cell 22h side may be shaped to receive radiation directed toward the solar cell from the left which crosses radiation directed toward the solar cell from the right before striking the receiving surface.

Figure 13D:
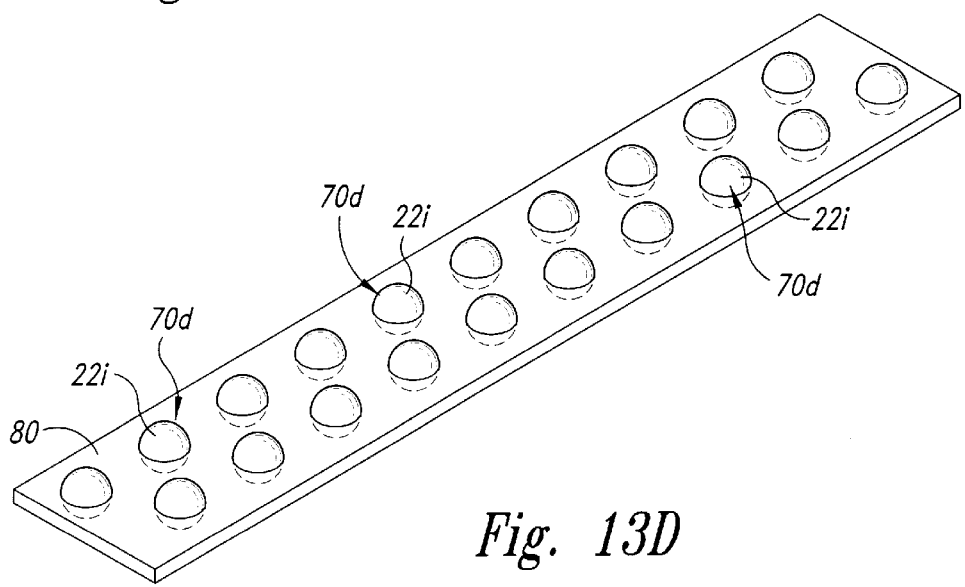
FIG. 13D is an isometric view of still another alternate embodiment of the solar cell shown in FIG. 1.

In still another alternate embodiment of the solar cell shown in FIG. 13D, a plurality of spherical solar cells 22i are embedded in a strip 80. Each solar cell 22i has a spherical radiation receiving surface 70d shaped to receive impinging radiation. The space between the solar cells 22i may be filled with an optical adhesive (not shown) similar in composition to the adhesive layer 36 discussed above with reference to FIGS. 1 and 2. The strip 80, with solar cell 22i and adhesive 82 attached may be substituted for the solar cell 22 shown in FIGS. 1 and 2.

Although specific embodiments of, and examples for, the present invention are described herein for illustrative purposes, various equivalent modifications are possible within the scope of the invention, as will be recognized by those skilled in the relevant art. The teachings provided herein of the present invention can be applied to other solar cell assemblies, not necessarily the exemplary assemblies described above. Solar cells having characteristics different than those described herein, and reflective members comprising different materials and having indices of refraction different than those described herein, can be employed under the present invention without deviating from the scope of the present invention. Furthermore, the reflective member described herein may be used to reflect and/or focus radiation for purposes other than energy conversion by solar cells.

All of the above U.S. patents and applications are incorporated herein by reference as if set forth in their entirety.

The above and other changes can be made to the invention in light of the above detailed description. In general, in the following claims, the terms used should not be construed to limit the invention to the specific embodiments disclosed in the specification and claims, but should be construed to include all the solar cell assemblies that operate under the claims to provide focused radiation to solar cells. Accordingly, the invention is not limited by the disclosure, but instead its scope is to be determined entirely by the following claims.

I claim:

1. A solar cell assembly, comprising:

a reflective member having first and second opposite surfaces, the first surface being substantially transparent, the second surface having a transparent portion and a plurality of opaque reflective portions, neighboring reflective portions being canted at least partially toward each other to receive radiation passing through the first surface of the reflective member and focus and reflect the radiation to form focused radiation directed toward the first surface at an angle relative to the first surface greater than a critical angle of the first surface, the first surface being positioned to direct the focused radiation away from the first surface, the focused radiation converging as it moves away from the first surface; and a solar cell having a radiation receiving surface affixed to the transparent portion of the second surface of the reflective member and positioned to receive the focused radiation.

2. The assembly of claim 1 wherein the reflective member comprises:

a support layer having first and second opposite surfaces, the first surface of the reflective member comprising the second surface of the support layer; and a film layer having first and second opposite surfaces, the first surface of the film layer being bonded to the first surface of the support layer, the second surface of the reflective member comprising the second surface of the film layer, wherein each opaque reflective portion of the reflective member includes a reflective metallic layer positioned to direct a portion of the focused radiation through the film layer and the support layer toward the second surface of the support layer without striking another reflective portion.

3. The assembly of claim 1 wherein the reflective member comprises:

a support layer having first and second opposite surfaces, the first surface of the reflective member comprising the second surface of the support layer; and a film layer having first and second opposite surfaces, the first surface of the film layer being bonded to the first surface of the support layer and forming the second surface of the reflective member.

4. The assembly of claim 1 wherein each reflective portion of the reflective member is positioned to direct the focused radiation toward the first surface without striking another reflective portion.

5. The assembly of claim 1 wherein the solar cell has first and second spaced apart ends and is elongated along a longitudinal axis extending between the ends, and the reflective portions are elongated substantially parallel to the longitudinal axis.

6. The assembly of claim 1 wherein the solar cell has a substantially circular shape and the reflective portions extend concentrically around the solar cell.

7. The assembly of claim 1 wherein the radiation receiving surface of the solar cell has first and second spaced apart edges and a central region intermediate the edges, the focused radiation impinging on the central portion of radiation receiving surface.

8. The assembly of claim 1 wherein the solar cell is a first solar cell, the plurality of opaque reflective portions is a first plurality, the radiation comprises a first radiation portion and the focused radiation is a first focused radiation portion, further comprising:

a second plurality of opaque reflective portions positioned to receive a second radiation portion passing through the first surface of the reflective member and focus and reflect the second radiation portion to form a second focused radiation portion directed toward the first surface at an angle relative to the first surface greater than a critical angle of the first surface. the first surface being positioned to direct the second focused radiation portion away from the first surface, radiation of the second focused radiation portion converging as it moves away from the first surface; and a second solar cell having a radiation receiving surface bonded to a second transparent portion of the second surface of the reflective member and positioned to receive the second focused radiation portion.

9. The assembly of claim 1 wherein the reflective member comprises acrylic and the solar cell is a first solar cell, the plurality of opaque reflective portions is a first plurality, the radiation comprises a first radiation portion and the focused radiation is a first focused radiation portion, further comprising:

a second plurality of opaque reflective portions positioned to receive a second radiation portion passing through the first surface of the reflective member and focus and reflect the second radiation portion to form a second focused radiation portion directed toward the first surface at an angle relative to the first surface greater than a critical angle of the first surface, the first surface being positioned to direct the second focused radiation portion away from the first surface, radiation of the second focused radiation portion converging as it moves away from the first surface; and a second solar cell having a radiation receiving surface bonded to a second transparent portion of the second surface of the reflective member and positioned to receive the second focused radiation portion, the second solar cell being spaced apart from the first solar cell by a distance in the range of approximately 1.8 to 2.22 times a thickness of the reflective member.

10. The assembly of claim 1 wherein the solar cell is a first solar cell, the plurality of opaque reflective portions is a first plurality, the radiation comprises a first radiation portion and the focused radiation is a first focused radiation portion, further comprising:

a second plurality of opaque reflective portions positioned to receive a second radiation portion passing through the first surface of the reflective member and focus and reflect the second radiation portion to form a second focused radiation portion directed toward the first surface at an angle relative to the first surface greater than a critical angle of the first surface, the first surface being positioned to direct the second focused radiation portion away from the first surface, radiation of the second focused portion converging as it moves away from the first surface; and a second solar cell having a radiation receiving surface bonded to a second transparent portion of the second surface of the reflective member and positioned to receive the second focused radiation portion, the second solar cell being spaced apart from the first solar cell by a distance approximately equal to 1.0 to 2.22 times a thickness of the reflective member.

11. The assembly of claim 1 wherein the solar cell is a first solar cell, the plurality of opaque reflective portions is a first plurality, the radiation comprises a first radiation portion and the focused radiation is a first focused radiation portion, further comprising:

a second plurality of opaque reflective portions positioned to receive a second radiation portion passing through the first surface of the reflective member and focus and reflect the second radiation portion to form a second focused radiation portion directed toward the first surface at an angle relative to the first surface greater than a critical angle of the first surface, the first surface being positioned to direct the second focused radiation portion away from the first surface, radiation of the second focused portion converging as it moves away from the first surface; and a second solar cell having a radiation receiving surface bonded to a second transparent portion of the second surface of the reflective member and positioned to receive the second focused radiation portion, each of the first plurality of reflective portions comprising a reflective metallic layer positioned to direct the first portion of the focused radiation through the reflective member toward the first surface, adjacent metallic layers being electrically coupled to each other to form a continuous conductive layer extending between the first and second solar cells, the first and second solar cells being electrically coupled to the conductive layer.

12. The assembly of claim 1 wherein the reflective member comprises an acrylic material.

13. The assembly of claim 1 wherein the reflective member comprises glass.

14. The assembly of claim 1 wherein the radiation receiving surface of the solar cell is substantially flat.

15. The assembly of claim 1 wherein the radiation receiving surface of the solar cell is convex, having first and second spaced apart edges and a central region intermediate the edges, the first surface of the reflective member being positioned closer to the central region of the solar cell than to the edges thereof.

16. The assembly of claim 1 wherein the radiation receiving surface of the solar cell is concave, having first and second spaced apart edges and a central region intermediate the edges, the first surface of the reflective member being positioned further from the central region of the solar cell than to the edges thereof.

17. The assembly of claim 1 wherein the solar cell is a first solar cell and the radiation comprises a first radiation portion, further comprising second, third and fourth solar cells, and wherein the plurality of opaque reflective portions includes a first reflective portion positioned to reflect the first portion of radiation toward the first solar cell, a second reflective portion facing opposite the first reflective portion and positioned to reflect a second portion of radiation toward the second solar cell, a third reflective portion positioned intermediate the first and second reflective portions to reflect a third portion of radiation toward the third solar cell, and a fourth reflective portion facing opposite the third reflective portion to reflect a fourth portion of radiation toward the fourth solar cell.

18. The assembly of claim 17 wherein the first, second, third and fourth reflective portions each have a triangular shape, the reflective portions being joined at a common point to form a pyramidal reflective element.

19. The assembly of claim 17 wherein at least one of the reflective portions has a flat surface.

20. The assembly of claim 17 wherein at least one of the reflective portions has a curved surface.

21. The assembly of claim 17 wherein the reflective portions together comprise a first reflective element and the solar cells together comprise a first solar cell group, the first solar cell group having a first diagonal axis extending from the reflective element between the first and third solar cells and a second diagonal axis extending from the reflective element between the second and third solar cells, further comprising a second reflective element and second solar cell group adjacent the first reflective element and first solar cell group, respectively, the second reflective element positioned on one of the first and second diagonal axes.

22. A solar cell assembly, comprising:

a reflective member having first and second opposite surfaces, the first surface being at least partially transparent, the second surface having a plurality of reflective portions, neighboring reflective portions being positioned to receive radiation passing through the first surface of the reflective member and converge and reflect the radiation to form converged radiation directed toward the first surface at an angle relative to the first surface greater than a critical angle of the first surface, the first surface being positioned to direct the converged radiation away from the first surface, the converged radiation converging as it moves away from the first surface; and a solar cell positioned at least proximate to the reflective member, the solar cell having a radiation receiving surface positioned to receive the converged radiation directed away from the first surface and generate an electrical current therefrom.

23. The assembly of claim 22 wherein the reflective member comprises:

a support layer having first and second opposite surfaces, the first surface of the reflective member comprising the second surface of the support layer; and a film layer having first and second opposite surfaces, the first surface of the film layer being bonded to the first surface of the support layer, the second surface of the reflective member comprising the second surface of the film layer, wherein each reflective portion of the reflective member includes a reflective metallic layer positioned to direct a portion of the converged radiation through the film layer and the support layer toward the second surface of the support layer without striking another reflective portion.

24. The assembly of claim 22 wherein each reflective portion of the reflective member is positioned to direct the converged radiation toward the first surface without striking another reflective portion.

25. The assembly of claim 22 wherein the solar cell is a first solar cell, the plurality of reflective portions is a first plurality, the radiation comprises a first radiation portion, and the converged radiation is a first converged radiation portion, further comprising:

a second plurality of reflective portions positioned to receive a second radiation portion passing through the first surface of the reflective member and converge and reflect the second radiation portion to form a second converged radiation portion directed toward the first surface at an angle relative to the first surface greater than a critical angle of the first surface, the first surface being positioned to direct the second converged radiation portion away from the first surface by total internal reflection, radiation of the second converged radiation portion converging as it moves away from the first surface; and a second solar cell positioned at least proximate to the reflective member, the second solar cell having a radiation receiving surface positioned to receive the second converged radiation portion and generate an electrical current therefrom.

26. The assembly of claim 22 wherein the solar cell is a first solar cell, the plurality of reflective portions is a first plurality, the radiation comprises a first radiation portion and the converged radiation is a first converged radiation portion, further comprising:

a second plurality of reflective portions positioned to receive a second radiation portion passing through the first surface of the reflective member and converge and reflect the second radiation portion to form a second converged radiation portion directed toward the first surface at an angle relative to the first surface greater than a critical angle of the first surface, the first surface being positioned to direct the second converged radiation portion away from the first surface, radiation of the second converged radiation portion converging as it moves away from the first surface; and a second solar cell having a radiation receiving surface bonded to a second transparent portion of the second surface of the reflective member and positioned to receive the second converged radiation portion, each of the first plurality of reflective portions comprising a reflective metallic layer positioned to direct the first portion of the converged radiation through the reflective member toward the first surface, adjacent metallic layers being electrically coupled to each other to form a continuous conductive layer extending between the first and second solar cells, the first and second solar cells being electrically coupled to the conductive layer.

27. The assembly of claim 22 wherein the solar cell is a first solar cell and the radiation comprises a first radiation portion, further comprising second and third solar cells, and wherein the plurality of reflective portions includes a first reflective portion positioned to reflect the first portion of radiation toward the first solar cell, a second reflective portion facing opposite the first reflective portion and positioned to reflect a second portion of radiation toward the second solar cell, the first and second solar cells defining an axis extending therebetween, the reflective portions further including a third reflective portion positioned intermediate the first and second reflective portions to reflect a third portion of radiation toward the third solar cell, the third solar cell being offset from the axis extending between the first and second solar cells.

28. A solar cell assembly, comprising:

a solar cell having a radiation receiving surface positioned to receive radiation and generate electrical current therefrom;

a reflective layer having a substantially transparent first surface and a second surface opposite the first, the second surface having a bonding portion bonded to the radiation receiving surface of the solar cell, and a plurality of spaced apart reflective portions, neighboring reflective portions positioned to receive a portion of radiation passing through the reflective layer from the first surface to the second surface and reflectively redirect the radiation portion along a reflected path extending away from the second surface, the reflected paths approaching each other as they extend away from the second surface; and a substantially transparent support layer having a first surface bonded to the first surface of the reflective layer and a second surface opposite the first, the support layer having an index of reffaction sufficient to receive the radiation portions reflected from the reflective layer and redirect by total internal reflection the radiation portions along redirected paths extending away from the first surface toward solar cell, the redirected paths approaching each other as they extend away from the first surface.

29. The assembly of claim 28 wherein the reflective member comprises:

a support layer having first and second opposite surfaces, the first surface of the reflective member comprising the second surface of the support layer; and a film layer having first and second opposite surfaces, the first surface of the film layer being bonded to the first surface of the support layer and forming the second surface of the reflective member.

30. The assembly of claim 28 wherein the reflective layer is bendable in a direction normal to the first surface thereof and the support layer is substantially rigid in a direction normal to the first surface thereof and is adhesively bonded to the reflective layer to restrict bending of the reflective layer in the direction normal to the first surface of the reflective layer, each reflective portion of the reflective layer comprising a reflective metallic layer positioned to reflect radiation from the reflective portion through the reflective layer and the support layer, each reflective portion being positioned to redirect the radiation portion along the corresponding reflected path without striking another reflective portion.

31. The assembly of claim 28, further comprising an adhesive layer positioned between the support layer and the reflective layer to bond the support layer and reflective layer together, the adhesive layer having an index of refraction substantially equal to an index of refraction of the support layer.

32. The assembly of claim 28, further comprising an adhesive layer positioned between the support layer and the reflective layer to bond the support layer and reflective layer together, the adhesive layer having an index of refraction substantially equal to an index of refraction of the reflective layer.

33. The assembly of claim 28 wherein the reflective layer has an index of refraction substantially equal to an index of refraction of the support layer.

34. The assembly of claim 28 wherein the reflective layer comprises an acrylic material and the support layer comprises glass.

35. A solar cell assembly, comprising:

a solar cell having a radiation receiving surface positioned to receive radiation and generate electrical current therefrom;

a reflective layer having a substantially transparent first surface and a second surface opposite the first, the second surface having a bonding portion bonded to the radiation receiving surface of the solar cell and a plurality of spaced apart reflective portions, neighboring reflective portions positioned to receive a portion of radiation passing through the reflective layer from the first surface to the second surface and reflectively redirect radiation portion along a reflected path extending away from the second surface, the reflected paths approaching each other as they extend away from the second surface, the first surface of the reflective layer having an index of refraction sufficient to receive the radiation portions reflected from the second surface thereof and redirect the radiation portions by total internal reflection toward the solar cell, the radiation portions converging as they move away from the first surface.

36. The assembly of claim 35 wherein the reflective portions each comprise a reflective metallic layer positioned to reflect radiation from the reflective portions through the reflective member toward the first surface, each reflective portion being positioned to redirect the radiation portion along the corresponding reflected path without striking another reflective portion.

37. A solar cell assembly, comprising:

first and second spaced apart solar cells, each having a radiation receiving surface; and a reflective member having first and second opposite surfaces, the first surface being substantially transparent, the second surface having first and second transparent portions bonded to the radiation receiving surfaces of the first and second solar cells, respectively, the second surface further having a plurality of opaque reflective units, each reflective portion having a first facet and an adjacent second facet, each of the first facets having a different angular orientation relative to the first surface to collectively receive a first portion of radiation passing through the first surface of the reflective member and reflectively focus and redirect the first portion of radiation toward the first surface at an angle relative to the first surface greater than a critical angle of the first surface, the first surface being positioned to direct the first radiation portion away from the first surface toward the first solar cell, the first radiation portion converging as it moves away from the first surface, each of the second facets having a different angular orientation relative to the first surface to collectively receive a second portion of radiation passing through the first surface of the reflective member and reflectively focus and redirect the second portion of radiation toward the first surface at an angle relative to the first surface greater than a critical angle of the first surface, the first surface being positioned to direct the second radiation portion away from the first surface toward the second solar cell, the second radiation portion converging as it moves away from the first surface.

38. A reflective assembly for focusing radiation, comprising:

a reflective member having first and second opposite surfaces, the first surface being at least partially transparent, the second surface having a plurality of reflective portions, neighboring reflective portions being canted at different angles relative to the first surface to receive radiation passing through the first surface of the reflective member and focus and reflect the radiation to form focused radiation directed toward the first surface at an angle relative to the first surface greater than a critical angle of the first surface, the first surface being positioned to direct the focused radiation away from the first surface, the focused radiation converging as it moves away from the first surface.

39. A method for focusing radiation on a radiation receiving surface of a solar cell, comprising:

directing the radiation through a substantially transparent first surface of a reflective member toward a second surface of the reflective member opposite the first surface;

reflecting a first portion of the radiation away from a first opaque portion of the second surface to form a first portion of reflected radiation directed toward the first surface;

reflecting a second portion of the radiation away from a second opaque portion of the second surface adjacent the first portion to form a second portion of reflected radiation directed toward the first surface and toward the first portion of reflected radiation; and reflecting the first and second reflected radiation portions at the first surface to direct the reflected radiation portions toward each other and toward the receiving surface of the solar cell.

40. The method of claim 39 wherein the act of reflecting the first portion of the radiation includes directing the first portion of reflected radiation toward the first surface at an angle greater than a critical angle of the first surface.

41. The method of claim 39 wherein the act of reflecting the second portion of the radiation includes directing the second portion of reflected radiation toward the first surface at an angle greater than a critical angle of the reflective member.

42. The method of claim 39, further comprising selecting a thickness of the reflective member to direct the first and second portions of reflected radiation to impinge at substantially the same location on the radiation receiving surface of the solar cell.

43. The method of claim 39, further comprising selecting a thickness of the reflective member to direct the first and second portions of reflected radiation to impinge on the radiation receiving surface of the solar cell at first and second spaced apart locations, respectively.

44. The method of claim 39, further comprising selecting a thickness of the reflective member to focus the first and second reflected radiation portions by a desired amount on the receiving surface of the solar cell.

45. The method of claim 39 wherein the act of reflecting the second portion of the radiation includes preventing the second portion of reflected radiation from impinging on the first opaque portion.

* * * * *